(12) United States Patent  
Okuda et al.

(10) Patent No.: US 11,315,912 B2  
(45) Date of Patent: Apr. 26, 2022

(54) IMAGE DISPLAY DEVICE

(71) Applicant: PANASONIC INTELLECTUAL PROPERTY MANAGEMENT CO., LTD., Osaka (JP)

(72) Inventors: Ichiro Okuda, Osaka (JP); Shuji Yamashita, Nara (JP); Jun Araya, Osaka (JP); Chiharu Matsukawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/969,744

(22) PCT Filed: Nov. 28, 2019

(86) PCT No.: PCT/JP2019/046475  
§ 371 (c)(1),  
(2) Date: Aug. 13, 2020

(87) PCT Pub. No.: WO2020/202637  
PCT Pub. Date: Oct. 8, 2020

(65) Prior Publication Data  
US 2021/0233898 A1 Jul. 29, 2021

(30) Foreign Application Priority Data  
Apr. 4, 2019 (JP) .............................. JP2019-072149

(51) Int. Cl.  
*H01L 25/16* (2006.01)  
*G09F 9/33* (2006.01)  
(Continued)

(52) U.S. Cl.  
CPC ............ *H01L 25/165* (2013.01); *A47F 3/001* (2013.01); *A47F 3/005* (2013.01); *A47F 11/06* (2013.01);  
(Continued)

(58) Field of Classification Search  
None  
See application file for complete search history.

(56) References Cited

U.S. PATENT DOCUMENTS

| 2012/0105424 A1 | 5/2012 | Lee et al. |
| 2018/0025679 A1 | 1/2018 | Park et al. |

(Continued)

FOREIGN PATENT DOCUMENTS

| JP | 2003-125904 A | 5/2003 |
| JP | 2014-503835 A | 2/2014 |

(Continued)

OTHER PUBLICATIONS

International Search Report dated Jan. 28, 2020 in International Application No. PCT/JP2019/046475.

*Primary Examiner* — Ashok Patel  
(74) *Attorney, Agent, or Firm* — McDermott Will & Emery LLP

(57) ABSTRACT

An image display device according to the present disclosure includes: a display panel; a frame unit; and a driver. The display panel is switchable between an image display mode in which an image is displayed and a transmissive mode in which the display panel is in a transmissive state where an object behind the display panel is visible in a front view of the display panel. The frame unit includes an upper plate disposed along an upper edge of the display panel and protruding rearward. The driver includes a circuit unit which drives the display panel. The driver is supported by the upper plate on a bottom side of the upper plate.

7 Claims, 6 Drawing Sheets

(51) Int. Cl.
*A47F 3/00* (2006.01)
*A47F 11/06* (2006.01)
*G09F 19/00* (2006.01)

(52) U.S. Cl.
CPC .............. *G09F 9/335* (2021.05); *G09F 19/00* (2013.01); *H01L 25/162* (2013.01); *H01L 25/167* (2013.01)

(56) References Cited

U.S. PATENT DOCUMENTS

| | | | |
|---|---|---|---|
| 2018/0164031 A1 | 6/2018 | Lee et al. | |
| 2020/0098997 A1* | 3/2020 | Watabe | H01L 51/0072 |

FOREIGN PATENT DOCUMENTS

| | | |
|---|---|---|
| JP | 3190343 U | 4/2014 |
| JP | 2017-513069 A | 5/2017 |
| WO | 2012/057457 A1 | 5/2012 |

* cited by examiner

IMAGE DISPLAY DEVICE

CROSS-REFERENCE OF RELATED APPLICATIONS

This application is the U.S. National Phase under 35 U.S.C. § 371 of International Patent Application No. PCT/JP2019/046475, filed on Nov. 28, 2019, which in turn claims the benefit of Japanese Application No. 2019-072149, filed on Apr. 4, 2019, the entire disclosures of which Applications are incorporated by reference herein.

TECHNICAL FIELD

The present disclosure relates to an image display device which includes a display panel operable in a transmissive mode.

BACKGROUND ART

Patent Literature (PTL) 1 discloses a showcase with a transparent display and a display function. The transparent display is capable of displaying advertising information related to commercial products. By advertising with use of the transparent display in this way, a buyer of a product is capable of viewing the product and advertisement in a superimposed manner.

CITATION LIST

Patent Literature

[PTL 1] Japanese Unexamined Patent Application Publication No. 2003-125904

SUMMARY OF INVENTION

Technical Problem

The present disclosure provides an image display device in which the back side of the display panel can be easily used.

Solution to Problem

An image display device according to the present disclosure includes: a display panel switchable between an image display mode and a transmissive mode, the image display mode being a mode in which an image is displayed, the transmissive mode being a mode in which the display panel is in a transmissive state where an object behind the display panel is visible in a front view of the display panel; a frame unit which includes an upper frame disposed along an upper edge of the display panel and protruding rearward; and a driver which includes a circuit unit and is supported by the upper frame on a bottom side of the upper frame, the circuit unit driving the display panel.

Advantageous Effects of Invention

According to the image display device in the present disclosure, the back side of the display panel can be easily used.

DESCRIPTION OF EMBODIMENT

The inventors of the present application have found the following problem in a conventional showcase with a display function. In the conventional showcase with a display function, a drive circuit which drives a transparent display is disposed behind the transparent display, on the inner side relative to the lateral side of the showcase. Since the drive circuit is disposed behind the transparent display, on the inner side relative to the lateral side of the showcase in this way, the usable range of the back side of the transparent display is limited, which may lead to a case where the back side of the transparent display is difficult to use.

The present disclosure has been conceived based on such finding. As a result of intensive studies by the inventors of the present application, the inventors have arrived at an idea of a configuration of an image display device in which the back side of the display panel can be easily used.

Hereinafter, an embodiment will be described with reference to the drawings, as necessary. Note that unnecessarily detailed descriptions may be omitted. For example, detailed descriptions of already known matters and overlapping description of substantially the same configuration may be omitted. This is to avoid the following description to become unnecessarily redundant, and to facilitate understanding of the person skilled in the art. Note that the drawings are not necessarily precise illustrations.

The inventors of the present application provide the accompanying drawings and the following description so that the person skilled in the art fully understands the present disclosure, and do not intend to limit the subject matter of the claims by this.

Moreover, in the following embodiment, the vertical (top-bottom) direction is represented by a Z-axis, the front-back direction is represented by a Y-axis, and the horizontal (left-right) direction is represented by an X-axis for the sake of description, but these do not limit the orientation of the image display device according to the present disclosure at the time of manufacture or usage. Additionally, in the following descriptions, for example, a positive X-axis indicates the direction of the arrow of the X-axis and a negative X-axis indicates the direction opposite to the X-plus axis. The same applies to the Y-axis and the Z-axis.

Moreover, in the following embodiment, language such as parallel or perpendicular may be used to indicate the relative orientation of two directions, but this includes cases where the orientation is not as exactly stated. For example, "two directions are parallel" includes, in addition to exactly parallel, substantially parallel, that is to say, for example, includes a margin of error of about a few percent, unless otherwise noted.

Hereinafter, an embodiment will be described with reference to the drawings.

[Configuration of Image Display Device]

Figure 1:
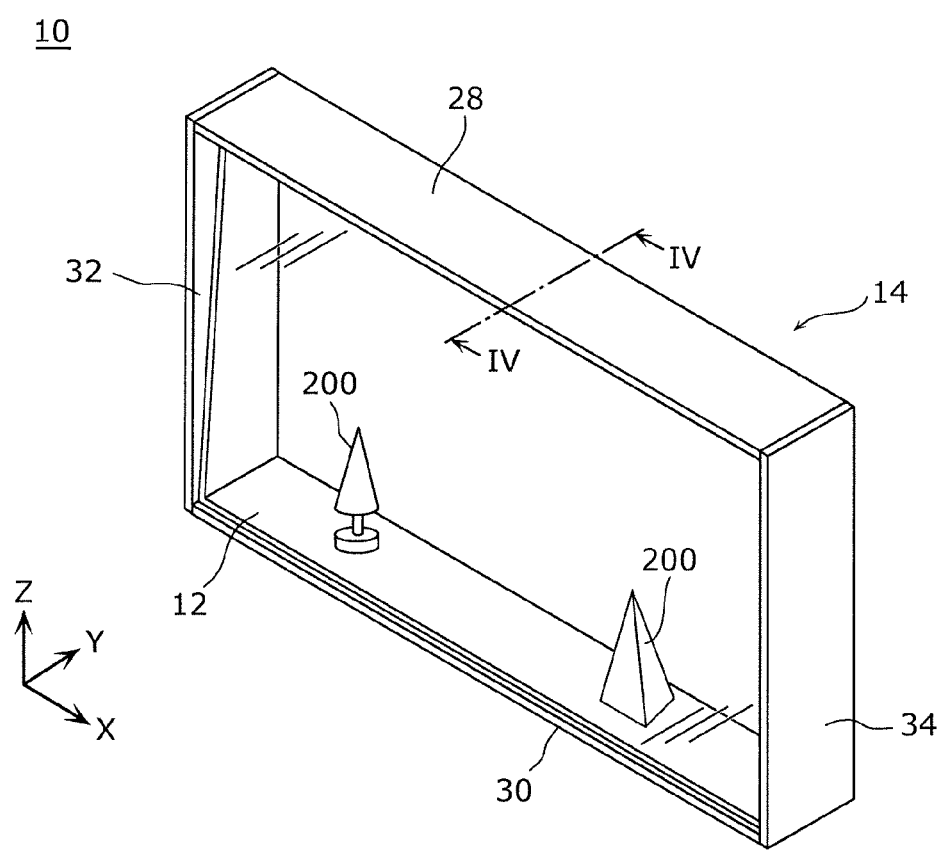
FIG. 1 is an external perspective view of a state of an image display device according to an embodiment when operating in a first transmissive mode.
Figure 2:
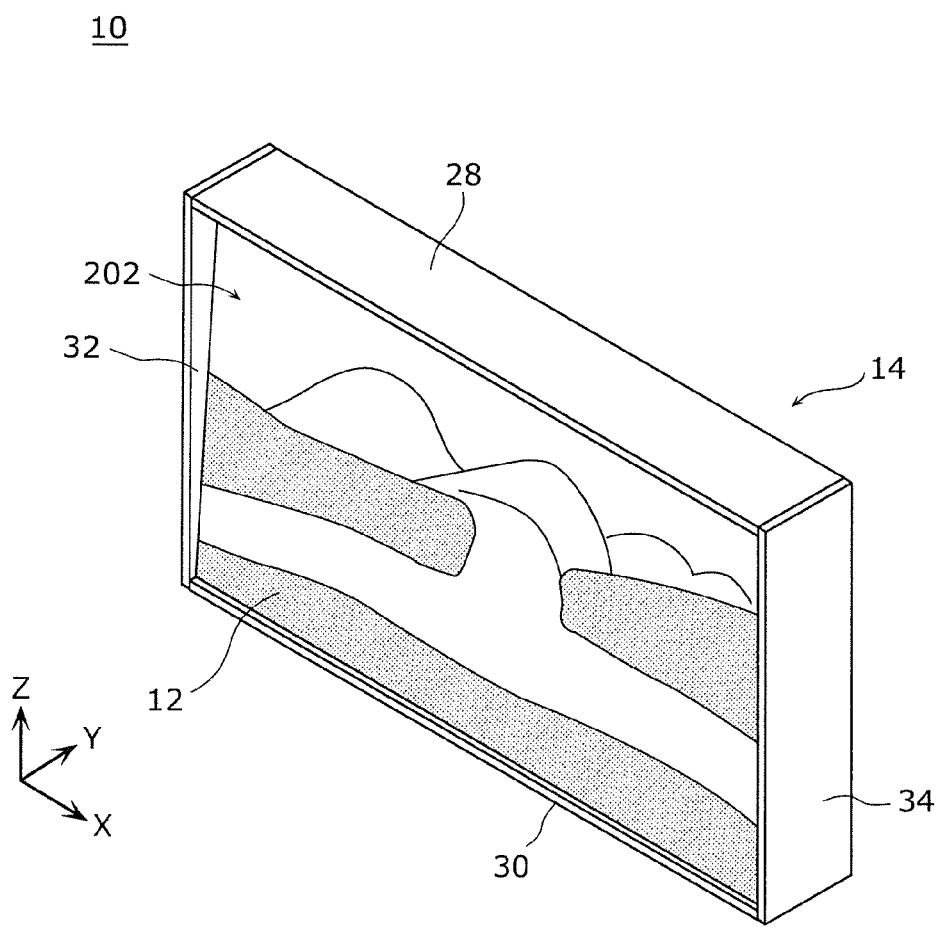
FIG. 2 is an external perspective view of a state of the image display device according to the embodiment when operating in an image display mode.
Figure 3:
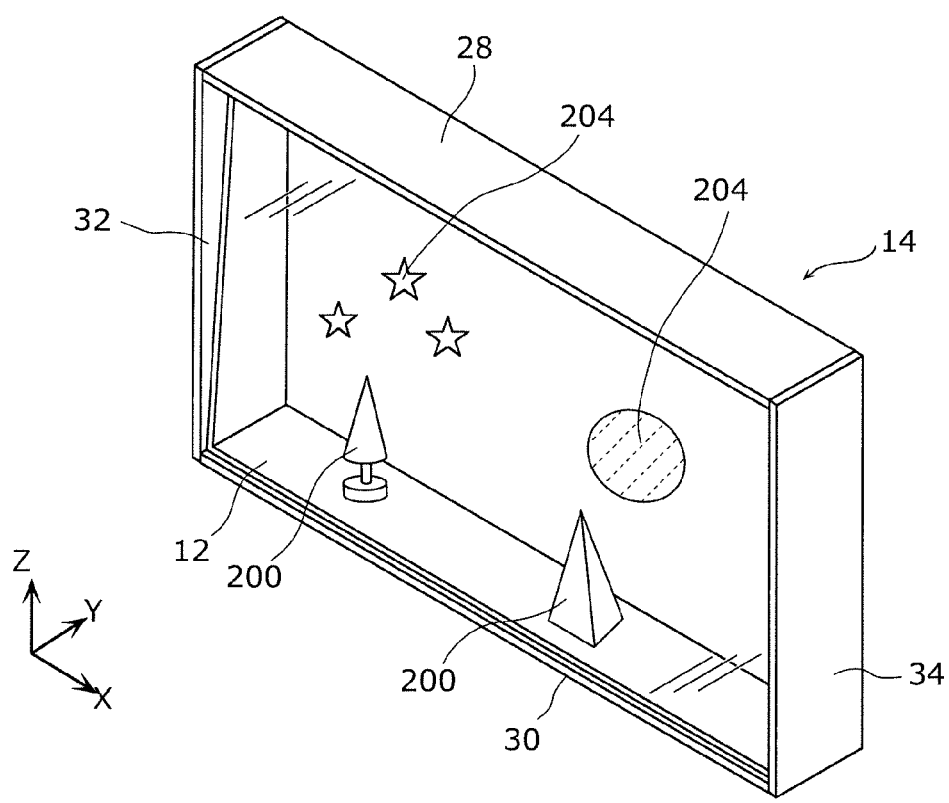
FIG. 3 is an external perspective view of a state of the image display device according to the embodiment when operating in a second transmissive mode.
Figure 4:
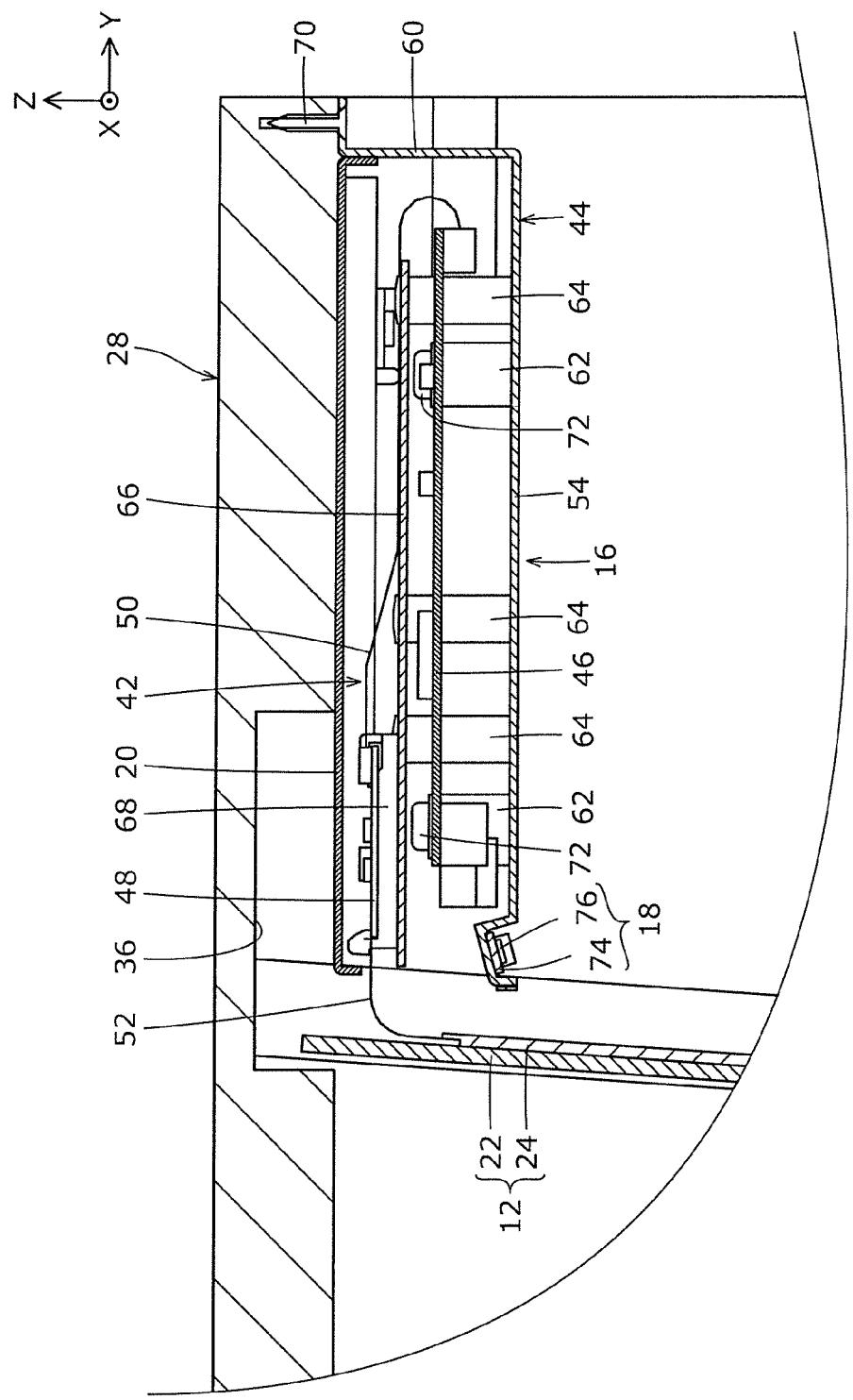
FIG. 4 is a cross-sectional view taken along line IV-IV in FIG. 1.
Figure 5:
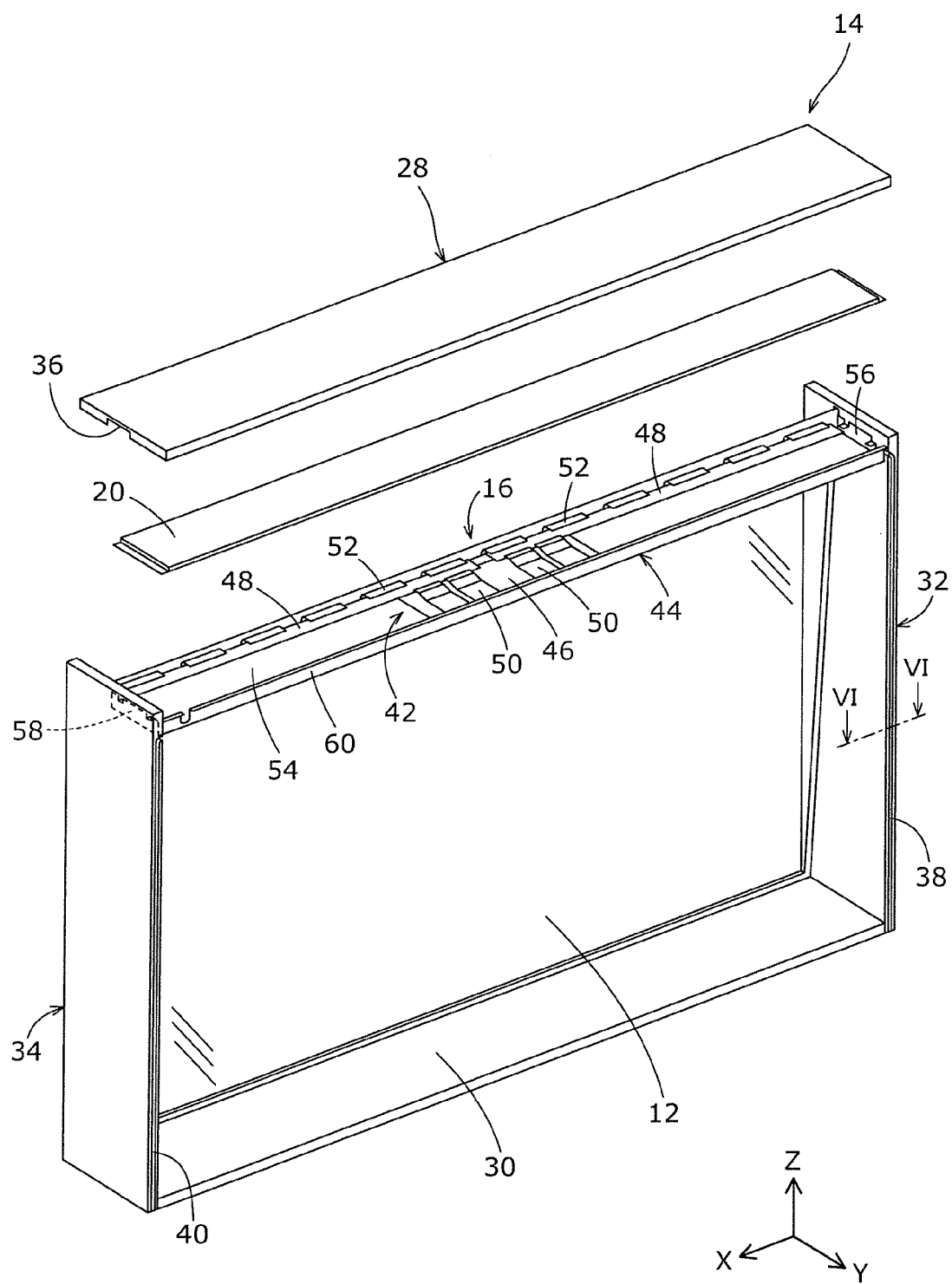
FIG. 5 is a rearward exploded perspective view of a state of the image display device according to the embodiment when operating in the first transmissive mode.
Figure 6:
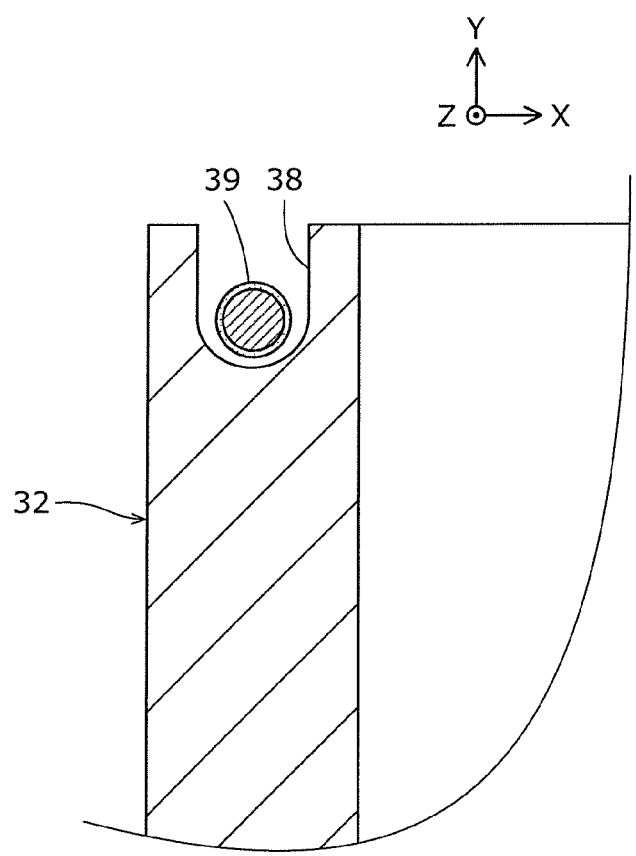
FIG. 6 is a cross-sectional view taken along line VI-VI in FIG. 5.

FIG. 1 is an external perspective view of a state of image display device 10 according to an embodiment when operating in a first transmissive mode. FIG. 2 is an external perspective view of a state of image display device 10 according to the embodiment when operating in an image display mode. FIG. 3 is an external perspective view of a state of image display device 10 according to the embodiment when operating in a second transmissive mode. FIG. 4 is a cross-sectional view taken along line IV-IV in FIG. 1. FIG. 5 is a rearward exploded perspective view of a state of image display device 10 according to the embodiment when operating in the first transmissive mode. FIG. 6 is a cross-sectional view taken along line VI-VI in FIG. 5. Note that illustration of plate 66 (to be described later) and the like is omitted in FIG. 5 in order to prevent the drawing from becoming complicated.

As illustrated in FIG. 1, FIG. 4, and FIG. 5, image display device 10 according to the present embodiment includes display panel 12, frame unit 14, driver 16, illumination unit 18, and heat dissipator 20.

(Display Panel)

As illustrated in FIG. 1 to FIG. 3, display panel 12 is a display device switchable between an image display mode in which an image is displayed and a transmissive mode in which display panel 12 is in a transmissive state where each of objects behind display panel 12 is visible in the front view of display panel 12. Display panel 12 has a rectangular shape in the front view. Specifically, as illustrated in FIG. 4, display panel 12 is an organic electro-luminescent (EL) panel, and includes front glass plate 22 and organic light-emitting diode (OLED) panel 24 disposed behind front glass plate 22. In the present embodiment, organic EL elements, each of which includes an EL layer and transparent electrodes sandwiching the EL layer, are disposed in a matrix in OLED panel 24. The region of OLED panel 24 where an image (including background image) is not displayed has light transmitting properties to the extent generally referred to as transparent. Note that the "image" displayed on display panel 12 may be any of a still image or a moving image, or may be video content including both the still image and the moving image.

Display panel 12 becomes, for example, as illustrated in FIG. 1, a first transmissive mode, in which one or more objects 200 behind display panel 12 is visible, by not displaying an image on display panel 12. Moreover, as illustrated in FIG. 2, display panel 12 becomes an image display mode by displaying image 202 on the entire region of the image display region of display panel 12. Moreover, as illustrated in FIG. 3, display panel 12 becomes a second transmissive mode in which objects 200 behind display panel 12 are visible while partial images 204 are displayed by displaying partial images 204 in a portion of the image display region of display panel 12. In the present embodiment, each of the first transmissive mode and the second transmissive mode corresponds to a transmissive mode. Moreover, display panel 12 may include, for example, an optical component, such as an anti-reflection film, in addition to the above described structural elements. Display panel 12 may also include a back glass plate disposed behind OLED panel 24 as a reinforcing component. Moreover, display panel 12 does not have to include front glass plate 22. Moreover, display panel 12 may include a back glass plate disposed behind OLED panel 24 without including front glass plate 22.

(Frame Unit)

As illustrated in FIG. 1, FIG. 4 and FIG. 5, frame unit 14 is a component disposed along the edge of display panel 12, and supports display panel 12. Frame unit 14 supports display panel 12 such that display panel 12 tilts slightly rearward. Frame unit 14 includes upper plate 28 disposed along the upper edge of display panel 12, lower plate 30 disposed along the lower edge of display panel 12, left plate 32 disposed along the left edge of display panel 12, and right plate 34 disposed along the right edge of display panel 12. Each of upper plate 28, lower plate 30, left plate 32, and right plate 34 has a plate shape. Each of upper plate 28, lower plate 30, left plate 32, and right plate 34 protrudes forward and rearward relative to display panel 12. Upper plate 28 and lower plate 30 are disposed parallel to each other, and left plate 32 and right plate 34 are disposed parallel to each other.

Upper plate 28 includes groove 36 recessed upward. The upper edge of display panel 12 is housed in groove 36. Although details will be described later, upper plate 28 supports driver 16 on the bottom side of upper plate 28. Lower plate 30 includes a groove recessed downward. The lower edge of display panel 12 is housed in the groove. One or more objects 200 (photo, doll, vase, toy, model, picture and the like) can be placed on the top surface of lower plate 30. When display panel 12 operates in a transmissive mode, the user is capable of viewing objects 200 placed on the top surface of lower plate 30 via display panel 12. Left plate 32 connects the left edge of upper plate 28 and the left edge of lower plate 30. Left plate 32 includes a groove recessed toward the left. The left edge of display panel 12 is housed in the groove. Left plate 32 also includes, on the back end surface, groove 38 which is recessed forward and extends in the vertical direction. For example, power line 39 which electrically connects an external power supply (not illustrated) and driver 16 (circuit unit 42) is housed (see FIG. 6) in groove 38. Right plate 34 includes a groove recessed toward the right. The right edge of display panel 12 is housed in the groove. Right plate 34 also includes, on the back end surface, groove 40 which is recessed forward and extends in the vertical direction. For example, power line 39 which electrically connects an external power supply (not illustrated) and driver 16 (circuit unit 42) is housed in groove 40. The number of power lines housed in grooves 38 and 40 may be one or plural. The cross-sectional shape of the power line is not limited to a circular shape, but may be a square shape or the like. Moreover, it may be that the diameter of the power line is greater than the depth of each of grooves 38 and 40, and that the power line is housed in grooves 38 and 40 while part of the power line is protruding from grooves 38 and 40. For power line 39, for example, a power line is used in which a conductor, such as a copper line, is covered by an insulator.

For the materials of upper plate 28, lower plate 30, left plate 32, and right plate 34, for example, wood can be used. With this, for example, when image display device 10 is used in a room where wooden furniture or the like is placed, loss of interior aesthetic can be prevented. In the present embodiment, upper plate 28 corresponds to an upper frame, lower plate 30 corresponds to a lower frame, left plate 32 corresponds to a left frame, and right plate 34 corresponds to a right frame. Moreover, in the present embodiment, each of left plate 32 and right plate 34 corresponds to a side frame.

(Driver)

As illustrated in FIG. 4 and FIG. 5, driver 16 includes: circuit unit 42 which controls operations of display panel 12 and illumination unit 18; and support 44 which supports circuit unit 42. Driver 16 is supported by upper plate 28 on the bottom side of upper plate 28.

Circuit unit 42 includes one first board 46, two second boards 48, a plurality of first wiring components 50 which electrically connect first board 46 and second boards 48, and a plurality of second wiring components 52 which electrically connect second boards 48 and display panel 12. Circuit unit 42 is dispose so as to be housed within the thickness of support 44 (width in the Z-axis direction). For first wiring components 50 and second wiring components 52, for example, flexible printed circuits (FPC) can be used. One or more boards forming a tuner or the like may be disposed on the left side and/or the right side of first board 46.

First board 46 forms a so-called timing controller. First board 46 generates various types of signals, such as a clock signal for distributing image data to be displayed on display panel 12 to each pixel included in display panel 12, and supplies the signals to second boards 48 via first wiring components 50. First board 46 is disposed in the central portion of support 44 in the horizontal direction.

Second boards 48 supply, to display panel 12 via second wiring components 52, the various signals supplied from first board 46. Two second boards 48 are disposed adjacent to each other in the horizontal direction. Two second boards 48 are disposed above first board 46, and overlap with part of first board 46 in the vertical direction. As described above, circuit unit 42 drives display panel 12 by supplying various signals to display panel 12.

Support 44 extends in the horizontal direction, is attached onto the bottom surface of upper plate 28, and connects left plate 32 and right plate 34. Support 44 includes bottom portion 54, left portion 56, right portion 58, back portion 60, a plurality of bosses 62, a plurality of bosses 64, plate 66, and fixing portion 68. Bottom portion 54 extends in the horizontal direction, has a plate shape, and is disposed substantially parallel to upper plate 28. The front edge of bottom portion 54 has a cross-section with a substantial reverse U shape (see FIG. 4). Illumination unit 18 is supported by the front edge of bottom portion 54. Left portion 56 protrudes upward from the left edge of bottom portion 54, and is disposed along left plate 32. Left portion 56 is fixed to left plate 32 by bolts (not illustrated). Right portion 58 protrudes upward from the right edge of bottom portion 54, and is disposed along right plate 34. Right portion 58 is fixed to right plate 34 by bolts (not illustrated). Left portion 56 is fixed to left plate 32 and right portion 58 is fixed to right plate 34, so that support 44 connects left plate 32 and right plate 34. Back portion 60 protrudes upward from the back edge of bottom portion 54. The upper edge of back portion 60 is folded rearward, and is fixed to upper plate 28 by a plurality of bolts 70. A plurality of bosses 62 protrude upward from the top surface of bottom portion 54. First board 46 is disposed on the top surface of bosses 62, and is fixed to support 44 by a plurality of bolts 72. A plurality of bosses 64 protrude upward from the top surface of bottom portion 54. The height from the top surface of bottom portion 54 to the top surface of boss 64 is greater than the height from the top surface of bottom portion 54 to the top surface of boss 62. Plate-shaped plate 66 is disposed on the top surfaces of bosses 64. Fixing portion 68 is disposed on the top surface of plate 66, and second boards 48 are sandwiched by fixing portion 68, so that second boards 48 are fixed to support 44. For example, first board 46 and second boards 48 may be supported by upper plate 28 by being pasted to the bottom surface of upper plate 28, or may be supported by upper plate 28 by being hung down from the bottom surface of upper plate 28. Moreover, heat generated from circuit unit 42, illumination unit 18 and the like may be dissipated by support 44.

(Illumination Unit)

As illustrated in FIG. 4, illumination unit 18 is disposed on the front edge of bottom portion 54 of support 44, and is electrically connected to circuit unit 42 by power lines (not illustrated). As described above, minute light shielding elements, such as organic EL elements and liquid crystals, are dispersed in display panel 12. Hence, even when display panel 12 operates in the transmissive mode, the light transmittance of display panel 12 is, for example, 40% to 50% approximately. Accordingly, for example, when image display device 10 is placed in a relatively dark environment, the user may fail to clearly view the back side of display panel 12. However, the back side of (the region behind) display panel 12 can be illuminated by the light emitted by illumination unit 18.

Illumination unit 18 includes: board 74 embedded in the front edge of bottom portion 54 and elongated in the horizontal direction; and a plurality of LED elements 76 which are mounted on board 74 and emit light. The back side of display panel 12 is illuminated by illumination unit 18 configured as above, so that the back side of display panel 12 becomes bright. Moreover, the light emitted from illumination unit 18 is reflected by lower plate 30. The reflected light illuminates the back side of display panel 12, so that the back side of display panel 12 becomes brighter. In the case where one or more objects 200 are placed on lower plate 30, one or more objects 200 placed on lower plate 30 are illuminated by illumination unit 18.

(Heat Dissipator)

As illustrated in FIG. 4 and FIG. 5, heat dissipator 20 is a component which dissipates heat generated from driver 16. Heat dissipator 20 extends in the horizontal direction and has a plate shape. Heat dissipator 20 is attached to support 44 so as to cover the portion above circuit unit 42. The left edge of heat dissipator 20 is connected to left portion 56 of support 44, and is attached to left portion 56. The right edge of heat dissipator 20 is connected to right portion 58 of support 44, and is attached to right portion 58. Moreover, the back edge of heat dissipator 20 is folded downward, and is connected to back portion 60 of support 44.

Advantageous Effects, Etc.

As described above, image display device 10 according to the present embodiment includes display panel 12, frame unit 14, and driver 16. Display panel 12 is switchable between an image display mode in which an image is displayed and a transmissive mode in which display panel 12 is in a transmissive state where objects 200 behind display panel 12 are visible in the front view of display panel 12. Frame unit 14 includes upper plate 28 which is disposed along the upper edge of display panel 12 and protrudes rearward. Driver 16 includes circuit unit 42 which drives display panel 12, and is supported by upper plate 28 on the bottom side of upper plate 28.

With such a configuration, driver 16 is supported by upper plate 28 on the bottom side of upper plate 28 disposed along the upper edge of display panel 12. Accordingly, it is possible to prevent driver 16 from being seen by the user in front of display panel 12. Additionally, a component which supports driver 16 is not required other than upper plate 28, which facilitates use of the back side of display panel 12.

Moreover, in image display device 10 according to the present embodiment, frame unit 14 further includes lower plate 30 which is disposed along the lower edge of display panel 12 and protrudes rearward.

With such a configuration, because driver 16 does not have to be housed in or disposed on lower plate 30, this facilitates placement of objects 200 and the like on lower plate 30 behind display panel 12. This facilitates use of the back side of display panel 12. In addition, for example, in the case where a vase or an aquarium is placed on lower plate 30 and even if water leaks, it is possible to prevent driver 16 from getting wet.

Moreover, in image display device 10 according to the present embodiment, circuit unit 42 includes first board 46 and second boards 48 stacked in the vertical direction.

With such a configuration, since first board 46 and second boards 48 are stacked in the vertical direction, the size of image display device 10 in the horizontal direction can be reduced compared to the case where first board 46 and second boards 48 are disposed adjacent to each other in the horizontal direction.

Moreover, in image display device 10 according to the present embodiment, frame unit 14 further includes left plate 32 disposed along the left edge of display panel 12 and right plate 34 disposed along the right edge of display panel 12. Left plate 32 includes groove 38 extending in the vertical direction for housing power line 39 connected to circuit unit 42. Right plate 34 includes groove 40 extending in the vertical direction for housing power line 39 connected to circuit unit 42.

With such a configuration, by housing power line 39 in grooves 38 and 40, it is possible to prevent power line 39 connected to circuit unit 42 from being seen by the user in front of display panel 12. Moreover, by housing power line 39 in grooves 38 and 40, it is possible to prevent power line 39 from getting in the way when the back side of display panel 12 is used. This further facilitates use of the back side of display panel 12.

Moreover, in image display device 10 according to the present embodiment, driver 16 further includes support 44 which supports circuit unit 42 and which connects left plate 32 and right plate 34.

With such a configuration, circuit unit 42 can be supported by support 44. In addition, by support 44 connecting left plate 32 and right plate 34, the strength of image display device 10 can be increased so that left plate 32 and right plate 34 do not fall over.

Moreover, image display device 10 according to the present embodiment further includes illumination unit 18 which illuminates the region behind display panel 12 and which is supported by support 44.

With this configuration, objects 200 placed on lower plate 30 can be illuminated by the light emitted from illumination unit 18. Moreover, illumination unit 18 is supported by support 44 which supports circuit unit 42. Accordingly, since illumination unit 18 is disposed near circuit unit 42, the power line which connects illumination unit 18 and circuit unit 42 can be shortened. This prevents the power line behind display panel 12 from getting in the way, facilitating the use of the back side of display panel 12.

Moreover, image display device 10 according to the present embodiment further includes heat dissipator 20 which is disposed above circuit unit 42 and which is connected to support 44.

Such a configuration facilitates dissipation of the heat generated from circuit unit 42 by heat dissipator 20. Moreover, heat dissipator 20 is connected to support 44. Accordingly, the heat generated from illumination unit 18 supported by support 44 is transmitted to heat dissipator 20 via support 44, which also facilitates dissipation of the heat generated from illumination unit 18.

Other Embodiments, Etc.

As described above, the embodiment has been described as an example of the technique disclosed in the present application. However, the technique according to the present disclosure is not limited to such an example, and is also applicable to embodiments to which various kinds of modifications, replacements, additions, omissions and the like have appropriately been made. Moreover, each structural element described in the above embodiment may be combined to obtain a new embodiment. Another embodiment will be described below as an example.

In the embodiment described above, the case has been described where display panel 12 does not include a light control panel, but the present disclosure is not limited to such an example. For example, the display panel may include a light control panel disposed behind the organic EL panel.

In the embodiment described above, the case has been described where plate-shaped frame unit 14 (upper plate 28, lower plate 30, left plate 32, and right plate 34) is disposed along the edge of display panel 12, but the present disclosure is not limited to such an example. For example, a frame having a prism shape or the like may be disposed along the edge of display panel 12.

In the embodiment described above, the case has been described where frame unit 14 includes upper plate 28, lower plate 30, left plate 32, and right plate 34, but the present disclosure is not limited to such an example. For example, the frame unit may include only an upper frame, or include only an upper frame and a lower frame. Moreover, the frame unit may include only an upper frame and a left frame, or may include only an upper frame and a right frame.

In the embodiment described above, the case has been described where left plate 32 includes groove 38, and right plate 34 includes groove 40, but the present disclosure is not limited to such an example. For example, only one of the left frame or the right frame includes a groove.

In the embodiment described above, the case has been described where left plate 32 includes groove 38 on the back end surface of left plate 32, but the present disclosure is not limited to such an example. For example, left plate 32 may include a groove on the left-side surface or the right-side surface. In the embodiment described above, the case has been described where right plate 34 includes groove 40 on the back end surface of right plate 34, but the present disclosure is not limited to such an example. For example, right plate 34 may include a groove on the left-side surface or the right-side surface.

In the embodiment described above, the case has been described where frame unit 14 supports display panel 12 such that display panel 12 slightly tilts rearward, but the present disclosure is not limited to such an example. For example, the frame unit may support display panel 12 such that display panel 12 does not tilt in the front and back direction.

In the embodiment described above, the case has been described where display panel 12 is positioned in front of driver 16 (see FIG. 4). However, for example, a blind component may be disposed on display panel 12, in front of driver 16. The blind component is, for example, printed on front glass plate 22. By disposing the blind component, it is possible to prevent driver 16 from being seen by the user in front of display panel 12.

Moreover, for example, a weight or the like may be disposed on lower plate 30. By disposing the weight or the like on lower plate 30, the center of gravity of image display device 10 can be lowered, which reduces the chance of image display device 10 from falling over.

As described above, the embodiment has been described as an example of the technique disclosed in the present disclosure. For this purpose, the accompanying drawings and detailed description are provided.

Accordingly, the structural elements described in the accompanying drawings and detailed description may include not only structural elements which are essential for solving the problem but also structural elements which are not essential for solving the problem but are provided for illustrating the technique. Therefore, the non-essential structural elements described in the attached drawings and/or the detailed description should not be instantly acknowledged to be essential structural elements.

Since the above embodiment is intended to illustrate the technique in the present disclosure, it is possible to make various kinds of modifications, replacements, additions, omissions, and the like within the scope of the claims or an equivalent scope thereof.

INDUSTRIAL APPLICABILITY

The present disclosure is applicable to an image display device, such as a television receiver, a monitor display, or a digital signage.

The invention claimed is:

1. An image display device, comprising:
  a display panel switchable between an image display mode and a transmissive mode, the image display mode being a mode in which an image is displayed, the transmissive mode being a mode in which the display panel is in a transmissive state where an object behind the display panel is visible in a front view of the display panel;
  a frame unit which includes an upper plate disposed along an upper edge of the display panel in the front view and protruding rearward; and
  a driver which includes a circuit unit and is supported by the upper plate on a bottom surface of the upper plate in the front view, the circuit unit driving the display panel,
  wherein the circuit unit includes a first board, and
  the first board is disposed such that a thickness direction of the first board is in a vertical direction in the front view.

2. The image display device according to claim 1, wherein the frame unit further includes a lower plate disposed along a lower edge of the display panel in the front view and protruding rearward.

3. The image display device according to claim 1, wherein the circuit unit further includes a second board, and
  the first board and the second board are stacked in the vertical direction.

4. An image display device, comprising:
  a display panel switchable between an image display mode and a transmissive mode, the image display mode being a mode in which an image is displayed, the transmissive mode being a mode in which the display panel is in a transmissive state where an object behind the display panel is visible in a front view of the display panel;
  a frame unit which includes an upper plate disposed along an upper edge of the display panel in the front view and protruding rearward; and
  a driver which includes a circuit unit and is supported by the upper plate on a bottom surface of the upper plate in the front view, the circuit unit driving the display panel,
  wherein the frame unit further includes a side frame disposed along one of a left edge and a right edge of the display panel in the front view, and
  the side frame includes a groove extending in a vertical direction for housing a power line connected to the circuit unit.

5. The image display device according to claim 4, wherein the side frame includes a left plate and a right plate, the left plate being disposed along the left edge of the display panel, the right plate being disposed along the right edge of the display panel, and
  the driver further includes a support which supports the circuit unit, the support connecting the left plate and the right plate.

6. The image display device according to claim 5, further comprising:
  an illumination unit which illuminates a region behind the display panel and is supported by the support.

7. The image display device according to claim 5, further comprising:
  a heat dissipator disposed above the circuit unit and connected to the support.

* * * * *